United States Patent
Xiong et al.

(10) Patent No.: US 7,741,632 B2
(45) Date of Patent: Jun. 22, 2010

(54) INGAAIN LIGHT-EMITTING DEVICE CONTAINING CARBON-BASED SUBSTRATE AND METHOD FOR MAKING THE SAME

(75) Inventors: Chuanbing Xiong, Nanchang (CN); Fengyi Jiang, Jiang Xi (CN); Li Wang, Jiang Xi (CN); Yingwen Tang, Jiang Xi (CN); Changda Zheng, Jiang Xi (CN); Junlin Liu, Jiang Xi (CN); Weihua Liu, Jiang Xi (CN); Guping Wang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 310 days.

(21) Appl. No.: 11/778,213

(22) Filed: Jul. 16, 2007

(65) Prior Publication Data

US 2008/0265265 A1      Oct. 30, 2008

(30) Foreign Application Priority Data

Apr. 29, 2007    (CN) .................... 2007 1 0107760

(51) Int. Cl.
*H01L 33/00*    (2010.01)
(52) U.S. Cl. ............................. 257/13; 257/14; 257/97; 257/E33.008; 257/E33.068; 438/33
(58) Field of Classification Search ............. 257/13–14, 257/97; 438/33
See application file for complete search history.

(56) References Cited

U.S. PATENT DOCUMENTS

| 5,389,799 | A | 2/1995 | Uemoto |
| 6,521,917 | B1 | 2/2003 | Takayama |
| 6,903,364 | B1 | 6/2005 | Takayama |
| 2002/0110282 | A1 | 8/2002 | Kraft |
| 2004/0241447 | A1* | 12/2004 | Fukushima ................. 428/408 |
| 2005/0006664 | A1 | 1/2005 | Inoue |
| 2005/0161698 | A1 | 7/2005 | Takayama |
| 2006/0255341 | A1* | 11/2006 | Pinnington et al. ............ 257/79 |
| 2008/0157090 | A1* | 7/2008 | Thomson et al. .............. 257/66 |

FOREIGN PATENT DOCUMENTS

JP    2007-35898    *    2/2007

* cited by examiner

*Primary Examiner*—A. Sefer
(74) *Attorney, Agent, or Firm*—Park, Vaughan & Fleming LLP

(57) ABSTRACT

One embodiment of the present invention provides an InGaAlN-based semiconductor light-emitting device which comprises an InGaAlN-based semiconductor multilayer structure and a carbon-based substrate which supports InGaAlN-based semiconductor multilayer structure, wherein the carbon-based substrate comprises at least one carbon-based layer. This carbon-based substrate has both high thermal conductivity and low electrical resistivity.

20 Claims, 10 Drawing Sheets

INGAAIN LIGHT-EMITTING DEVICE CONTAINING CARBON-BASED SUBSTRATE AND METHOD FOR MAKING THE SAME

BACKGROUND

1. Field of the Invention

The present invention relates to the design of semiconductor light-emitting devices. More specifically, the present invention relates to a method for fabricating InGaAlN-based semiconductor light-emitting devices on carbon-based substrates.

2. Related Art

Solid-state light-emitting devices are expected to lead the next wave of illumination technologies. High-brightness light-emitting diodes (HB-LEDs) are emerging in an increasing number of applications, from light source for display devices to light-bulb replacement for conventional lighting. Meanwhile, solid-state lasers continue to beam as the driving force in many critical technological fields, from optical data storage, to optical communication networks, and to medical applications.

In particular, recent success in the development of nitride-based $In_xGa_yAl_{1-x-y}N$ ($0<=x<=1, 0<=y<=1$) (InGaAlN-based hereafter) LEDs and lasers (e.g., GaN-based LEDs and lasers) not only extends the light-emission spectrum to the green, blue, and ultraviolet region, but also can achieve high light emission efficiency. InGaAlN-based semiconductor light-emitting devices have been widely used in applications including full-color large-screen displays, traffic lights, backlight source, and solid-state lighting.

Successful epitaxial growth of InGaAlN-based materials typically requires matching of the lattice constant and thermal-expansion coefficients of the substrate and epitaxial layers. Consequently, unconventional substrate materials, such as sapphire ($Al_2O_3$), are often used to grow InGaAlN materials in order to achieve such matching. Furthermore, these light-emitting devices are typically configured to have both positive and negative electrodes fabricated on the same side of the device.

Unfortunately, the above-described light-emitting devices often suffer from low utilization of the light-emitting material, low light-emission efficiency, and low thermal conductivity through the sapphire substrate. A further problem is associated with the fact that a typical Ohmic-contact layer can absorb some light during the emission process, and hence causes negative impact on the electro-optical property of the device. Moreover, sapphire substrates are typically expensive and are complex to fabricate, and can therefore lead to high manufacture costs.

Silicon (Si) substrates have low cost and can facilitate easy fabrication. Recent successes in research efforts have allowed semiconductor light-emitting structures to be fabricated on conventional Si substrates. However, if InGaAlN-based materials formed on Si substrates are used to fabricate light-emitting devices with the same-side electrode configuration, the following problems can arise: (1) Si substrate can absorb light emitted from active region of the device; (2) the same-side electrode configuration can reduce wafer utilization; and (3) P-type Ohmic-contact layer can also absorb some emitted light. On the other hand, if the device is fabricated with a vertical electrode configuration such that one of the two electrodes is formed directly on the Si substrate surface and below the light-emitting structure, the wafer utilization can be significantly improved. Unfortunately, the presence of an Aluminum Nitride (AlN) buffer layer above this bottom electrode can increase the operation bias voltage of the device, while the light absorption issues remain unsolved.

In recent years, researchers have been experimenting with wafer-bonding techniques to construct LEDs with vertical electrode configurations. During wafer bonding, a second support substrate with low resistance is bonded to the top of the InGaAlN-based LED multilayer structure fabricated on a Si growth substrate. The Si growth substrate is subsequently removed through wet etching, which effectively transfers the InGaAlN-based LED multilayer from the initial growth substrate to the new substrate. This process allows fabricating the InGaAlN-based LEDs which emit light through the N-type layer while having a vertical electrode configuration. Such vertical-configuration LEDs can improve light-emission efficiency, increase wafer utilization, and reduce serial resistance of the LEDs.

Note that after transferring the InGaAlN-based multilayer structure to the new substrate, the heat dissipation property of the new substrate can have significant impact on the quality of the final device. These new substrates are typically either Si substrates or metal substrates. Although Si substrates are easy to process, such as dicing and cutting, they have inferior thermal conductivity in comparison with single-element metals such as copper and silver, and some high thermal-conductivity alloys. On the other hand, even though metal substrates, such as copper and silver have high thermal conductivities, they suffer from other problems, such as being difficult to cut and having a mismatching thermal expansion coefficient with respect to the transferred InGaAlN-based layers.

Hence, what is needed is a new substrate which has high thermal conductivity and is easy to process for supporting the InGaAlN-based multilayer structure transferred from the initial growth substrate.

SUMMARY

One embodiment of the present invention provides an InGaAlN-based semiconductor light-emitting device which comprises an InGaAlN-based semiconductor multilayer structure and a carbon-based substrate which supports InGaAlN-based semiconductor multilayer structure, wherein the carbon-based substrate comprises at least one carbon-based layer. This carbon-based substrate has both high thermal conductivity and low electrical resistivity.

In a variation on this embodiment, the carbon-based layer can be made of: natural graphite; compressed graphite; pyrolytic graphite; metal impregnated graphite; carbon fiber-based compressed or knitted material; carbon nanotube-based laminated material; a compound material or a mechanical mixture containing any two of the above; or a compound material or a mechanical mixture containing two or more of the above.

In a variation on this embodiment, the carbon-based substrate can include one or more metal layers on each side of the substrate or one or more metal layers only on the front-side of the substrate facing the InGaAlN-based semiconductor multilayer structure.

In a variation on this embodiment, the InGaAlN-based semiconductor light-emitting device further comprises a metal layer situated between the carbon-based layer and the InGaAlN-based semiconductor multilayer structure. This metal layer can have a multilayer structure or a single layer structure, where in each layer in these structures can comprise a single element metal or an alloy.

In a further variation, the metal layer situated between the carbon-based layer and the InGaAlN-based semiconductor multilayer structure is etch-resistant to a Si etchant.

In a further variation, the metal layer includes a first Ohmic-contact layer for the InGaAlN-based semiconductor multilayer structure.

In a further variation, the InGaAlN-based semiconductor light-emitting device further comprises a second Ohmic-contact electrode fabricated on the top surface of the InGaAlN-based semiconductor multilayer structure. Hence, the first Ohmic-contact layer and the second Ohmic-contact electrode form the top and the bottom electrodes for the InGaAlN-based semiconductor light-emitting device.

In a variation on this embodiment, the InGaAlN-based semiconductor multilayer structure is originally fabricated on a silicon (Si)-growth substrate and subsequently transferred onto the carbon-based substrate by: bonding the Si-growth substrate and the carbon-based substrate through a welding process; and removing the Si-growth substrate through a wet-etching process.

In a variation on this embodiment, the carbon-based layer is adjacent to an infiltration layer which is permeable to the carbon-based layer. This infiltration layer can be made of a single element metal, an alloy layer, a conductive compound or non-metallic element.

One embodiment of the present invention provides a fabrication process for fabricating InGaAlN-based semiconductor light-emitting devices on a carbon-based substrate. During operation, InGaAlN-based semiconductor light-emitting structures, a first Ohmic-contact electrode layer, and a first bonding layer are fabricated on the Si substrate. The InGaAlN-based semiconductor light-emitting structures are then transferred from the Si substrate to a carbon/metal composite substrate which comprises at least one carbon-based layer and a metal bonding layer. Next, a second Ohmic-contact electrode is formed on the InGaAlN-based semiconductor light-emitting structures to obtain arrays of light-emitting devices. Finally, the carbon/metal composite substrate is diced to obtain the InGaAlN-based semiconductor light-emitting devices.

In a variation on this embodiment, the InGaAlN-based semiconductor light-emitting structures, the first Ohmic-contact electrode layer, and the first bonding layer are fabricated on the trench-partitioned Si substrate by: forming an $In_xGa_yAl_{1-x-y}N$ ($0 \leq x \leq 1$, $0 \leq y \leq 1$) (InGaAlN-based) semiconductor multilayer structure on the trench-partitioned Si substrate; forming the first Ohmic-contact electrode layer on the top of the InGaAlN-based semiconductor multilayer structure; and forming the metal bonding layer on the first Ohmic-contact electrode layer.

In a variation on this embodiment, the carbon/metal composite substrate is obtained by receiving a carbon-based layer and depositing an infiltration layer on the carbon-based layer, wherein the infiltration layer is a metal layer permeable to the carbon-based layer; and depositing a second bonding layer on the infiltration layer.

In a variation on this embodiment, the process transfers the InGaAlN-based semiconductor light-emitting structures by bonding the Si substrate and the carbon-based substrate through the first and second bonding layers and removing the Si substrate using a Si-etchant.

In a further variation, the process bonds the Si substrate and the carbon-based substrate using predetermined pressure and temperature.

In a variation on this embodiment, the process dices the carbon/metal composite substrate by creating dicing channels in the carbon-based substrate and grinding the carbon-based substrate to reduce the substrate thickness. When the grinding plane reaches the dicing channels, the InGaAlN-based semiconductor light-emitting devices become separated.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention facilitate fabricating InGaAlN-based semiconductor light-emitting devices on a carbon-based substrate. Specifically, InGaAlN-based semiconductor light-emitting structures, a first Ohmic-contact electrode layer, and a first bonding layer are first fabricated on a trench-partitioned Si substrate. The InGaAlN-based semiconductor light-emitting structures are then transferred from the Si substrate to a carbon-based substrate which comprises at least one carbon-based layer and a metal bonding layer. Next, a second Ohmic-contact electrode is formed on the InGaAlN-based semiconductor light-emitting structures to obtain arrays of light-emitting devices. Finally, the carbon/metal composite substrate is diced to obtain the InGaAlN-based semiconductor light-emitting devices.

First Embodiment

Figure 1:
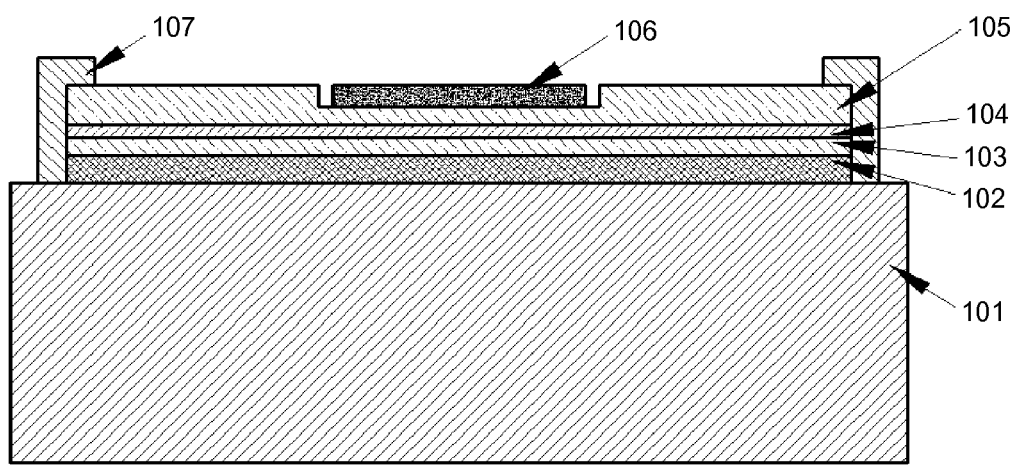
FIG. 1 illustrates a cross-sectional view of an InGaAlN-based light-emitting device on a carbon-based substrate, which is obtained using a first fabrication process in accordance with one embodiment of the present invention.

FIG. 1 illustrates a cross-sectional view of an InGaAlN-based light-emitting device on a carbon-based substrate, which is obtained using a first fabrication process in accordance with one embodiment of the present invention. In one embodiment, the light-emitting device is a light-emitting diode (LED). Specifically, the light-emitting device in FIG. 1 is formed by wafer-bonding an InGaAlN-based multilayer structure onto a carbon-based substrate using a metal bonding material.

More specifically, the light-emitting device of FIG. 1 comprises the following components: a carbon-based layer 101; a metal layer 102 which is situated between the InGaAlN-based multilayer structure and the carbon-based substrate; a P-type gallium nitride (GaN) layer 103; an InGaN/GaN multi-quantum-well (MQW) active layer 104; an N-type GaN layer 105; a second Ohmic-contact electrode 106; and sidewall passivation material 107.

FIG. 6A-6I illustrates a step-by-step process for fabricating the light-emitting device in FIG. 1 in accordance with one embodiment of the present invention.

Figure 6A:
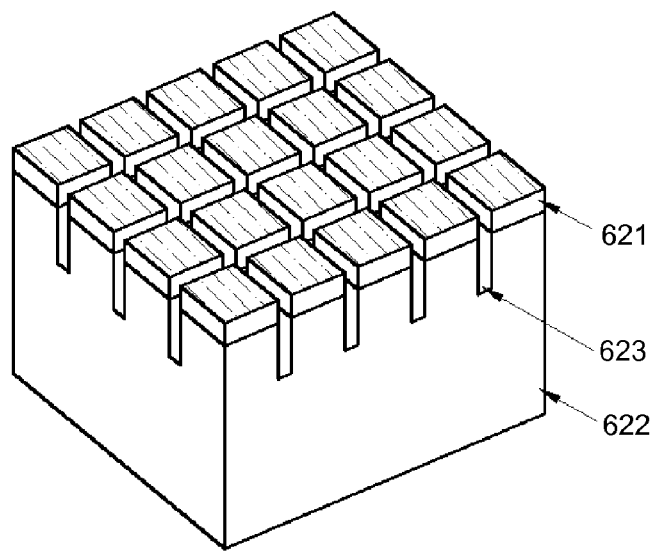
FIG. 6A illustrates the epitaxial substrate for fabricating the light-emitting device in FIG. 1 in accordance with one embodiment of the present invention.

FIG. 6A illustrates the epitaxial substrate for fabricating the light-emitting device in FIG. 1 in accordance with one embodiment of the present invention.

Note that the epitaxial substrate comprises an original Si substrate 622. In one embodiment of the present invention, high resistivity Si is chosen for Si substrate 622. Such high resistivity Si substrate contains less impurities and defects, and therefore can facilitate obtaining high quality InGaAlN-based multilayer structure. In one embodiment, the growth surface of Si substrate 622 is Si (111) surface, which has an atom arrangement that matches with an InGaAlN-based layer that typically exhibits a Wurtzite crystal structure.

Si substrate 622 is partitioned into arrays of isolated deposition platforms by channels 623, which are used to prevent cracking of the multilayer structure due to thermal-expansion-coefficient mismatch between the InGaAlN multilayer structure and Si substrate 622. In one embodiment of the present invention, channels 623 are chosen to have a depth greater than 3 μm, and a width greater than 3 μm but less than 100 μm.

The isolated deposition platforms can have various shapes, which include, but are not limited to, square, rectangle, diamond, and triangle. In the embodiment illustrated in FIG. 6A, the deposition platforms have a square geometry. In this embodiment, the surface area of each isolated deposition platform is greater than 100×100 μm².

On each isolated deposition platform in FIG. 6A, InGaAlN multilayer structure 621 is formed using epitaxial growth techniques. In one embodiment, InGaAlN multilayer structure 621 is formed by using a chemical vapor deposition (CVD) technique. Specifically, an Aluminum Nitride (AlN) buffer layer is formed on substrate 622, which is followed by depositing an N-type GaN layer, an MQW active layer, a P-type GaN layer, and a thin InGaN cover layer, all in the aforementioned order. In one embodiment, the InGaN cover layer is approximately 2 nm thick.

Note that the buffer layer in multilayer structure 621 can alternatively comprise an AlN/GaN multilayer stack. The AlN materials within the buffer layer can include both those that match the stoichiometric ratio and those that deviate from the stoichiometric ratio. The N-type impurities in multilayer structure 621 typically include Si, while the P-type impurities typically include Magnesium (Mg). The MQW active layer can be either doped or undoped.

Note that the thin InGaN cover layer deposited on the P-type layer is used to apply a tension-stress force to the P-type GaN surface, and thereby causing the polarizing electrical field on the P-type surface to vary. This cover layer helps increase the hole density in the P-type surface, which can improve the Ohmic-contact quality of the P-type layer. This InGaN cover layer can be either doped with Mg or undoped. Also, note that this InGaN cover layer is optional, and can be considered as part of the P-type layer.

Figure 6B:
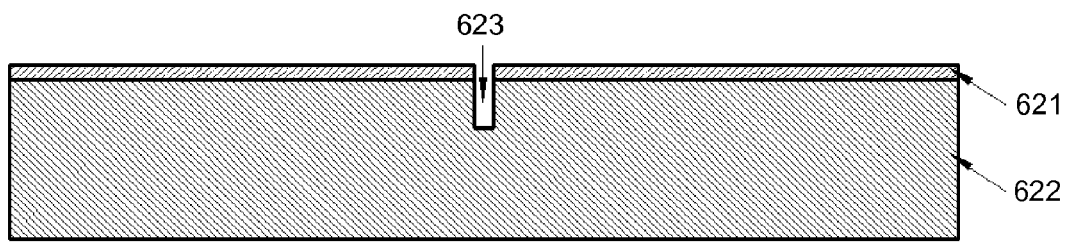
FIG. 6B illustrates the cross-sectional view of the epitaxial substrate of FIG. 6A in accordance with one embodiment of the present invention.

FIG. 6B illustrates the cross-sectional view of the epitaxial substrate of FIG. 6A in accordance with one embodiment of the present invention.

After forming channels 623 into Si substrate 622 to release the stress in multilayer structure 621, in one embodiment, a thermal annealing process is performed on the epitaxial substrate to activate the P-type impurities, for example, at a temperature of 760° C.

In a further embodiment, instead of performing thermal annealing on the epitaxial substrate, a P-type Ohmic-contact layer, such as a Platinum (Pt) layer is first evaporated on the P-type layer. Next, thermal annealing is performed on the P-type layer/Pt layer alloy. In one embodiment, the following annealing conditions are used: (1) annealing temperature: 550° C.; (2) Gas composition: $N_2:O_2=4:1$; and (3) annealing duration: 10 minutes. Under these conditions, the Mg impurities in the P-type layer can be effectively activated. In addition, the Pt layer is used to absorb hydrogen atoms produced during the annealing process which can have passivation effect on the Mg impurities. Note that if Pt is used for the P-type Ohmic-contact, the Pt layer thickness can be between 10 angstroms and 10000 angstroms.

To prevent the current-crowding effect between the N-type electrode and the P-type electrode in the final light-emitting device, a small Ohmic-contact-free region can be formed in the P-type layer using a photolithography technique. This small region can prevent the current-crowding problem and can help prevent the N-type electrode from blocking the light emission from the MQW structure below.

Figure 6C:
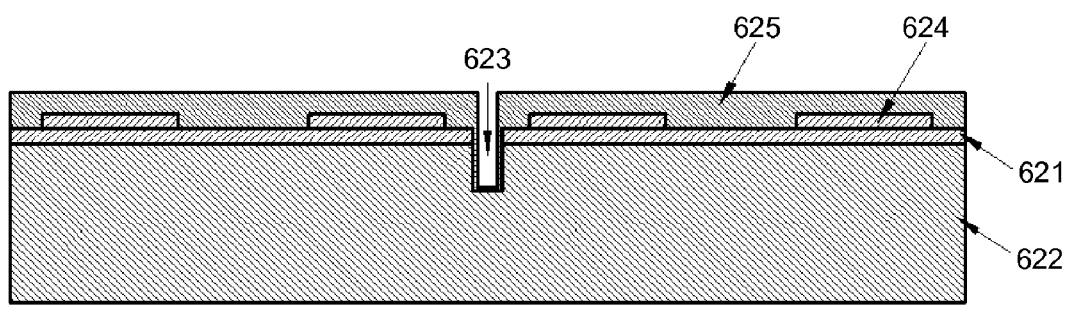
FIG. 6C illustrates the cross-sectional view of the epitaxial substrate of FIG. 6B after depositing an Ohmic-contact layer and a metal bonding layer in accordance with one embodiment of the present invention.

Typically, the P-type Ohmic-contact layer has a smaller footprint than InGaAlN multilayer structure 621 fabricated on the isolated deposition platforms (refer to item 624 in FIG. 6C). In one embodiment of the present invention, the P-type Ohmic-contact layer is made of a single Pt element. However, the P-type Ohmic-contact layer can also be made of Pt/gold (Au) alloy, Pt/Rhodium (Rh) alloy, AuNiO, InSnO, and other alloys. Alternatively, the P-type Ohmic-contact layer can include: a Pt/Au multilayer stack, a Pt/Rh multilayer stack, a Pt/Rh/Au multilayer stack, or a Pt, Rh, and Au ternary alloy.

To increase light extraction efficiency of the light-emitting device, the P-type Ohmic-contact layer can be made into a fully or partially transparent layer, and a light-reflection layer can be deposited immediately on this light-transparent layer. This light-transparent layer can include any of the above listed Ohmic-contact metal layer with a thickness less than 200 angstroms. Alternatively, the light-transparent layer can be made of AuNiO, InSnO, or a AuNiO/InSnO compound. If the Ohmic-contact layer is made of one of the oxide compound, the thickness can be either greater or less than 200 angstroms.

The metal light-reflection layer is directly underneath the light-reflection layer. In one embodiment of the present invention, the metal light-reflection layer is obtained by deposition an Ag layer. Alternatively, the metal light-reflection layer can also be an aluminum (Al) layer or an alloy with a high reflectivity in the visible-light range.

In one embodiment of the present invention, a dispersion-blocking layer is situated between the Ohmic-contact layer and the light-reflection layer to effectively prevent the metal light-reflection layer from damaging the Ohmic-contact layer. Such a dispersion-blocking layer has relatively high visible-light transmittance, and can be made of a material with stable chemical and physical properties. In one embodiment, the dispersion-blocking layer is made of Titanium Nitride (TiN).

FIG. 6C illustrates the cross-sectional view of the epitaxial substrate of FIG. 6B after depositing an Ohmic-contact layer 624 and a metal bonding layer 625 in accordance with one embodiment of the present invention.

To reduce light absorption by the Ohmic-contact layer, Ohmic-contact layer 624 can be fabricated as an array of metal dots rather than a continuous layer. Such an Ohmic-contact layer only occupies a small portion of the P-type surface, while other regions in the P-type surface can be the light-reflection layer or the dispersion-blocking layer which make direct contact with the P-type GaN layer. Alternatively, Ohmic-contact layer 624 can be a continuous layer.

In one embodiment, Ohmic-contact layer 624 can be obtained as follows: (1) forming an Ohmic-contact layer in the form of an array of metal dots in the region immediately next to the P-type layer; (2) forming a dispersion-blocking layer directly underneath the Ohmic-contact dot array, so that the dispersion-blocking layer also takes the form of an dot array; and (3) making direct contact between the P-type layer and the metal light-reflection layer within other regions of the P-type layer.

In one embodiment of the present invention, P-type Ohmic-contact layer 624 comprises the Ohmic-contact layer, the dispersion-blocking layer, and the light-reflection layer. Alternatively, P-type Ohmic-contact layer 624 can comprise only the Ohmic-contact layer. In a further embodiment, P-type Ohmic-contact layer 624 comprises both the Ohmic-contact layer and the light-reflection layer without the dispersion-blocking layer.

In one embodiment of the present invention, metal bonding layer 625 in FIG. 6C is made of a single-element metal with a thickness greater than 1000 angstroms. Alternatively, metal bonding layer 625 can also be an alloy containing Au, such as Au/In alloy, Au/Stannum (Sn) alloy, Au/Gallium (Ga) alloy, and Au/Antimony (Sb) alloy. Furthermore, metal bonding layer 625 can be an ternary or quaternary alloy of Au, Sn, Ga, and Sb that includes Au or a higher-than-quaternary alloy that includes Au. Metal bonding layer 625 can also be made of a binary or higher alloy that includes one or more elements of Au, Pt, Pd, Rh and one or more elements of Sn, Ga, Zn, In which have low melting points. Moreover, metal bonding layer 625 can be made of any alloy, compound, or mixture that includes one of the above elements with additional metals or compounds not listed above.

Figure 6D:
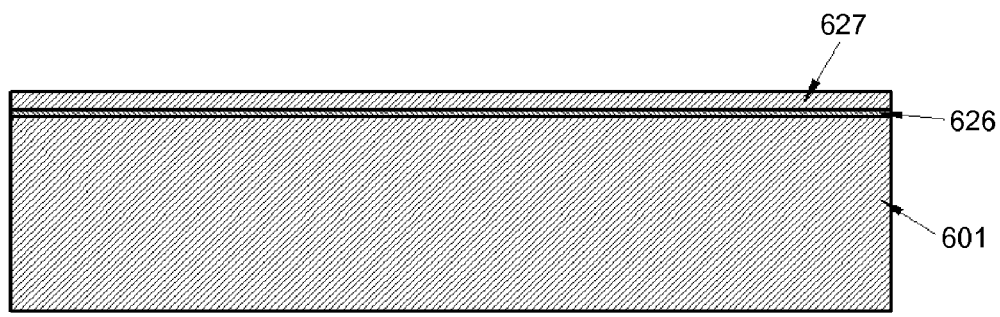
FIG. 6D illustrates the cross-sectional view of the carbon-based substrate in FIG. 1, which comprises a carbon-material infiltration layer and a metal bonding layer deposited on a carbon-based layer in accordance with one embodiment of the present invention.

FIG. 6D illustrates the cross-sectional view of a carbon-based substrate in FIG. 1, which comprises a carbon-material infiltration layer and a metal bonding layer deposited on a carbon-based layer in accordance with one embodiment of the present invention.

The carbon-based substrate comprises a carbon-based layer 601. In one embodiment of the present invention, carbon-based layer 601 is made of graphite, which has higher thermal conductivity than Si. The heat transfer characteristic of the carbon-based layer can be either isotropic or anisotropic. Carbon-based layer 601 can be made of compressed graphite obtained by using either a uniform compressing technique or a unidirectional compressing technique. Alternatively, carbon-based layer 601 can be made of natural graphite, soft graphite, graphite fiber, or compressed/knitted carbon fiber. Furthermore, carbon-based layer 601 can be metal impregnated graphite, such as Ag impregnated graphite, Cu impregnated graphite, or other metal or alloy impregnated graphite. Carbon-based layer 601 can be a compressed layer of multiple carbon-based materials or a carbon-based compound formed by compressing metals or other materials with graphite.

In one embodiment of the present invention, carbon-based layer 601 has a thermal conductivity greater than 0.5 W/cm·K, an electrical resistivity less than 1 Ω/cm, and a room temperature thermal expansion coefficient less than $16.5 \times 10^{-6}$/K (i.e., the thermal expansion coefficient of Cu).

The carbon-based substrate further comprises an infiltration layer 626 situated on carbon-based layer 601, wherein infiltration layer 626 is made of material that is highly permeable to carbon-based layer 601. In one embodiment of the present invention, infiltration layer 626 is made of one or more elements from Pt, Pd, Cr, Ti, and Ni, or an alloy of the above. Alternatively, infiltration layer 626 can be made of SiC, stainless steel, or common solder alloys used for graphite welding purpose.

Infiltration layer 626 can be made of materials that are resistant to Si-etchants. In one embodiment, infiltration layer 626 can also be made of materials that are etchable by an Si-etchant. In one embodiment, infiltration layer 626 has a thickness greater than 10 angstroms and can be deposited using fabrication techniques including, but are not limited to: radio-frequency (RF) sputtering deposition; direct-current (DC) sputtering deposition; thermal evaporation; electron-beam evaporation; CVD; soaking; electrical plating, and ion plating.

The carbon-based substrate can additionally include a bonding metal layer 627, which is disposed on top of infiltration layer 626. The choice for bonding metal layer 627 is substantially consistent with the choice for metal bonding layer 625 deposited on the epitaxial substrate in FIG. 6C to facilitate effective bonding.

Note that infiltration layer 626 can be alloyed immediately after its deposition on the carbon-based substrate. Alternatively, infiltration layer 626 can be alloyed after depositing bonding metal layer 627. After infiltration layer 626 has been alloyed, deposition of bonding layer can be continued. In one embodiment of the present invention, the thickness of bonding metal layer 627 is greater than 1000 angstroms. If carbon-based layer 601 has an anisotropic thermal conductivity, the direction associated with the higher thermal conductivity can be either parallel to or perpendicular to the normal direction of carbon-based layer 601. In one embodiment, the direction associated with the thermal conductivity can have a specific spatial angle with respect to the normal direction. In a further embodiment, the direction associated with the largest thermal conductivity is parallel to the normal direction of the carbon-based substrate.

Figure 6E:
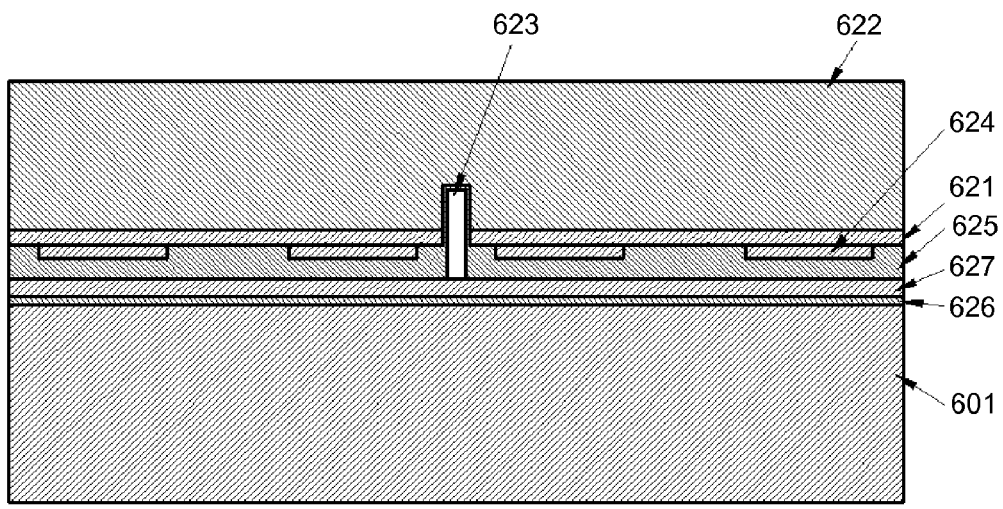
FIG. 6E illustrates the cross-sectional view of the epitaxial substrate in FIG. 6C and the carbon-based substrate in FIG. 6D after wafer bonding in accordance with one embodiment of the present invention.

After infiltration layer 626 and bonding metal layer 627 are deposited, the carbon-based substrate is wafer-bonded with the epitaxial substrate comprising Ohmic-contact layer 624 and metal bonding layer 625, as is shown in FIG. 6E.

FIG. 6E illustrates the cross-sectional view of the epitaxial substrate in FIG. 6C and the carbon-based substrate in FIG. 6D after wafer-bonding in accordance with one embodiment of the present invention.

To allow the two substrates to be firmly welded together, the combined substrates in FIG. 6E is subjected to heating and pressure over a specific period. As a result, bonding metal layer 627 in carbon-based substrate and metal bonding layer 625 in the epitaxial substrate merge to form metal layer 102 in FIG. 1, which is sandwiched between metal buffer layer 102 and carbon-based substrate 101. One embodiment of the present invention uses the following welding conditions: temperature: 320° C.; pressure: 800 kg over a two-inch wafer; holding time: 1000 seconds. The welding is performed under a vacuum condition, with a vacuum chamber pressure less than 30 Tor.

Upon completion, the temperature is decreased while the pressure is maintained. When the temperature reaches ambient temperature, the pressure is then released. However, welding can also be performed under a temperature greater or less than 320° C.; of pressure greater or less than 800 kg over a two-inch wafer; and of holding time longer or shorter than 1000 seconds. Furthermore, the welding can also be performed under the following conditions: in a high vacuum condition, in a low vacuum condition, or under atmosphere pressure. The gas environment can be a nitrogen environment, an oxygen environment, an environment of a mixture of nitrogen/oxygen, or a noble-gas environment.

Note that the welding conditions are not limited to the ones listed above. Any condition that can facilitate welding metal layer 627 in carbon-based substrate and metal bonding layer 625 in the epitaxial substrate together without significantly changing the properties of the P-type Ohmic-contact layer and InGaAlN layers can be used in the present invention.

After the carbon-based substrate and the epitaxial substrate have been firmly welded together, the combined structure is submerged in a Si-etchant. The Si-etchant etches and removes original growth Si substrate 622 from the epitaxial substrate, and therefore facilitates transferring InGaAlN multilayer structure 621 from the epitaxial substrate to the carbon-based substrate, as is shown in FIG. 6F.

Figure 6F:
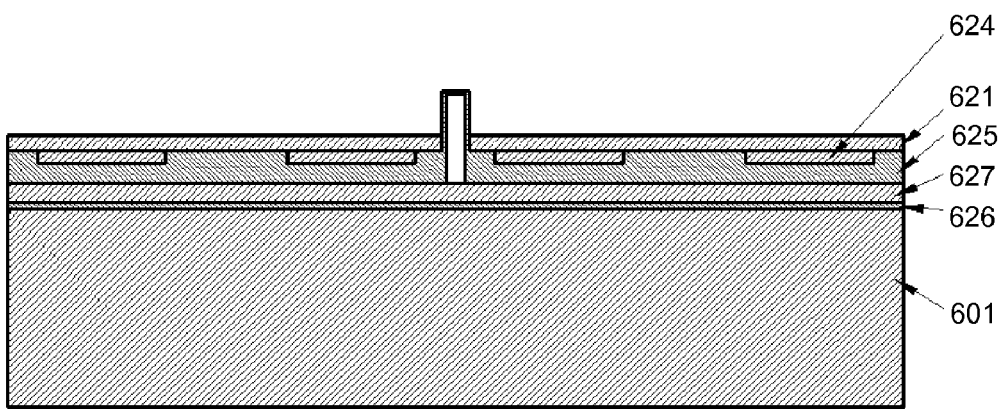
FIG. 6F illustrates the cross-sectional view of the light-emitting device which is transferred on the carbon-based substrate by removing the original growth substrate of the epitaxial substrate in FIG. 6E in accordance with one embodiment of the present invention.

Hence, FIG. 6F illustrates the cross-sectional view of the light-emitting devices which are transferred on the carbon-based substrate by removing the original growth substrate of the epitaxial substrate in FIG. 6E.

Note that the Si-etchant can be any etchant used for etching Si, including nitric acid, hydrofluoric acid, and acetic acid mix.

Figure 6G:
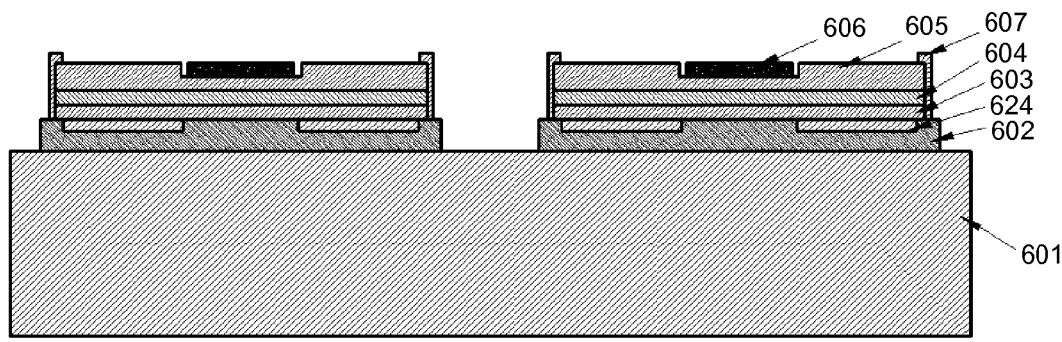
FIG. 6G illustrates the cross-sectional view of a chip array formed on the carbon-based substrate after a sequence of wafer fabrication processes in accordance with one embodiment of the present invention.

After removing original growth substrate 622, a sequence of wafer fabrication processes are performed to obtain the chip array as shown in FIG. 6G.

Hence, FIG. 6G illustrates the cross-sectional view of the chip array formed on the carbon-based substrate after the sequence of wafer fabrication processes.

The sequence of wafer fabrication processes include:

(1) Removing the InGaAlN-based material and metal which have been deposited in channel 623 of growth substrate 622. The removing techniques can include ultrasonic cleaning, compressed air blowing, or mechanical scrubbing.

(2) Removing a specific thickness of N-type layer 105 (see FIG. 1) within a region inside N-type layer 105, where N-type layer electrode metal is to be deposited. A pit structure is effectively etched into N-type layer 105, wherein the pit depth is not more than the thickness of N-type layer 105. The pit can be fabricated using a reactive ion etching (RIE) technique or a wet-etching technique. If an RIE technique is used, the reactive gas can include a chlorine-based gas or any other gas suitable for etching GaN. If a wet-etching technique is used, the etchant can include phosphoric acid, NaOH, or KOH. The wet-etching process can also be assisted by ultraviolet light illumination. Note that regions of N-type layer 105 which are not to be etched can be protected with a mask material, which can include photoresist, metal, or a combination of photoresist and metal.

(3) Forming N-type layer Ohmic-contact electrode 106 in the etched pit of N-type layer 105 and additionally removing low-quality boundary regions of InGaAlN multilayer structure 621 which are affected by the boundary effect due to the existence of channels 623 in growth substrate 622. The boundary removal technique can include any above-mentioned dry etching techniques, wet-etching techniques, or a combination of both. Note that N-type layer Ohmic-contact electrode 106 can be made of a Au/Germanium (Ge)/Ni alloy, a Au/Si alloy, TiN, Ti/Aluminum (Al) alloy, or a combination of two or more of the Au/Ge/Ni, Au/Si, TiN, and Ti/Al alloys. In one embodiment of the present invention, a cover layer is deposited on top of Ohmic-contact electrode 106 to facilitate welding lead wires on Ohmic-contact electrode 106. This cover layer can include a Ti/Au double-layer or Ni/Au double-layer.

(4) Removing excessive metal between chips in the chip array in FIG. 6A. This allows exposing spaces between chips for mechanical dicing of the chips, exposing carbon-based layer, and fabricating passivation layer 107/607 on the chip sidewalls. Note that if the graphite infiltration layers thickness is less than 2 μm, the graphite infiltration layer between the gaps of chips array can be left alone. The sidewall passivation material 107/607 can be inorganic insulating materials, such as $SiO_2$, $Al_2O_3$, or $Si_3N_4$. Passivation material 107/607 can also be organic insulating materials such as PI, and any other common passivation materials using in electronic devices.

Figure 6H:
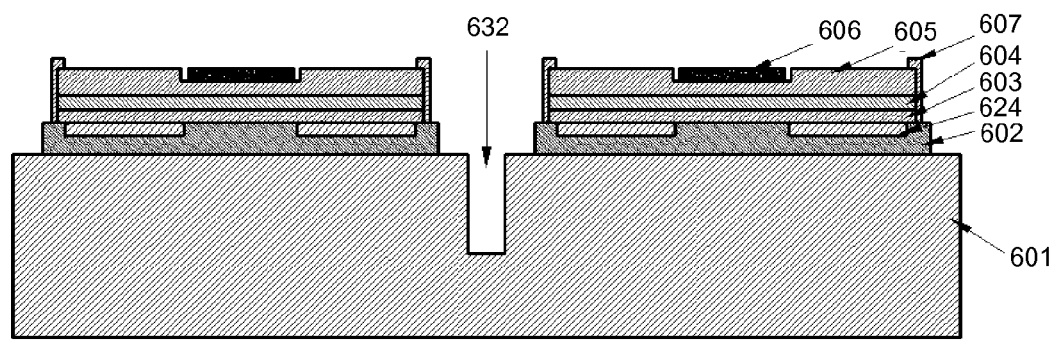
FIG. 6H illustrates the cross-sectional view of the chip array in FIG. 6G after forming dicing channels in the carbon-based substrate between the chips in accordance with one embodiment of the present invention.

FIG. 6H illustrates the cross-sectional view of the chip array in FIG. 6G after forming dicing channels in the carbon-based substrate between the chips in accordance with one embodiment of the present invention.

In one embodiment of the present invention, if the carbon-based layer is less than 1000 μm thick, the wafer can be cut into individual chips by directly sawing through the gaps between the chips using a mechanical dicing machine.

On the other hand, if the carbon-based layer is greater than 1000 μm thick, in one embodiment, a dicing channel 623 of sufficient depth is first created in substrate 601. Next, a wafer thinning process is performed on the backside of carbon-based substrate 601, for example, through wafer grinding. This wafer thinning process continues until the grinding plane reaches dicing channel 623, at which time the chips are naturally separated.

Regardless of the chip cutting technique, the thickness of carbon-based substrate 601 of the present invention is between 20 μm and 2000 μm. In particular, if carbon-based substrate 601 is made of a material that is less resistive to bending, a relatively thick carbon-based substrate 601 is preferred (for example, using a thickness of 1000 μm). After the chips have been transferred from growth substrate 622 to carbon-based substrate 601 and the chip array has been fabricated, dicing channel 623 are cut out. The wafer is then thinned down to meet dicing channel 623, thereby achieving chip separation. When the above wafer dicing technique is used, the depth of dicing channel 623 can be made equal to the final desirable chip thickness. Alternatively, a wafer can be diced by thinning the carbon-based substrate to the desirable substrate thickness, and subsequently separating the chips by wafer scribing.

Figure 6I:
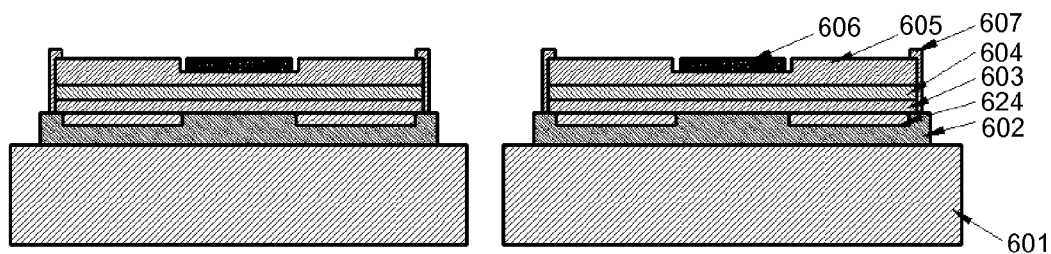
FIG. 6I illustrates the cross-sectional view of the array of physically separated chips after grinding down the carbon-based substrate in FIG. 6H to reach the dicing channels in accordance with one embodiment of the present invention.

FIG. 6I illustrates the cross-sectional view of the array of physically separated chips after grinding down the carbon-based substrate in FIG. 6H to reach the dicing channels in accordance with one embodiment of the present invention.

At this point, we have obtained the light-emitting devices on carbon-based substrate of the present invention.

Second Embodiment

Figure 2:
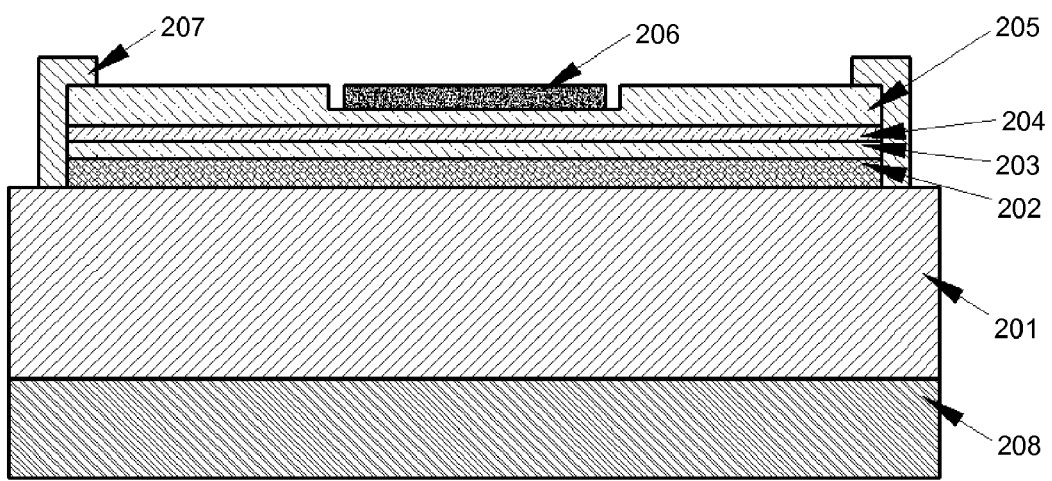
FIG. 2 illustrates a cross-sectional view of an InGaAlN-based light-emitting device on a carbon-based substrate, which is obtained using a second fabrication process in accordance with one embodiment of the present invention.

FIG. 2 illustrates a cross-sectional view of an InGaAlN-based light-emitting device on a carbon-based substrate, which is obtained using a second fabrication process in accordance with one embodiment of the present invention. In one embodiment, the light-emitting device is an LED. Specifically, the light-emitting device in FIG. 2 is formed by wafer bonding an InGaAlN-based multilayer structure onto a carbon/metal composite substrate using a wafer-bonding technique.

More specifically, the structure of FIG. 2 comprises the following components: a carbon-based layer 201; a metal layer 202 situated between the InGaAlN-based multilayer structure and the carbon-based substrate; a P-type GaN layer 203; an InGaN/GaN MQW active layer 204; and an N-type GaN layer 205. The structure of FIG. 2 further comprises a second Ohmic-contact electrode 206, sidewall passivation material 207, and a metal layer 208 which is used to reinforce carbon-based layer 201.

FIG. 7A-7G illustrates a step-by-step process for fabricating the light-emitting device in FIG. 2 in accordance with one embodiment of the present invention. Note that certain carbon-materials used to make carbon-based layer 201 can have very high thermal conductivity but relatively low strength. Hence, a carbon/metal composite substrate structure can enhance the strength of the carbon-based substrate by depositing a sufficiently thick metal layer on the backside of the carbon-based substrate.

FIG. 6A illustrates the epitaxial substrate for fabricating the light-emitting device in FIG. 2 in accordance with one embodiment of the present invention. The epitaxial substrate used in fabricating the devices of FIG. 2 has substantially the same characteristics as the epitaxial substrate used in the first embodiment.

Figure 7A:
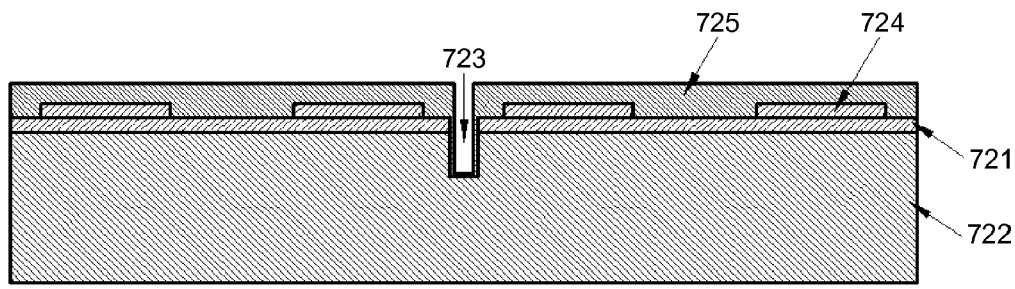
FIG. 7A illustrates the cross-sectional view of the epitaxial substrate for fabricating the light-emitting device in FIG. 2 after depositing an Ohmic-contact layer and a metal bonding layer in accordance with one embodiment of the present invention.

FIG. 7A illustrates the cross-sectional view of the epitaxial substrate for fabricating the light-emitting device in FIG. 2 after depositing an Ohmic-contact layer 724 and a metal bonding layer 725 in accordance with one embodiment of the present invention. Note that the epitaxial substrate as is shown in FIG. 7A has substantially the same characteristics as the epitaxial substrate after depositing Ohmic-contact layer 624 and metal bonding layer 625 in the first embodiment.

Figure 7B:
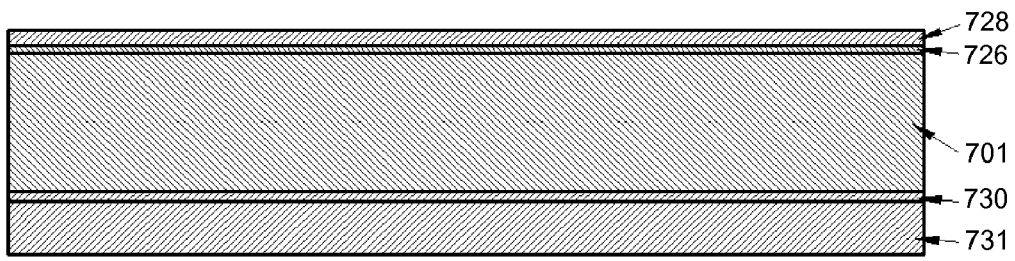
FIG. 7B illustrates the cross-sectional view of the "carbon/metal composite" substrate in FIG. 2, which comprises two carbon-material infiltration layers, a metal reinforcement layer, and a metal bonding layer in accordance with one embodiment of the present invention.

FIG. 7B illustrates the cross-sectional view of the carbon/metal composite substrate after forming graphite infiltration layers, a metal reinforcement layer, and a metal bonding layer in accordance with one embodiment of the present invention.

The carbon/metal composite substrate comprises a carbon-based layer 701, which has substantially the same characteristics as the corresponding carbon-based layer in the first embodiment. A carbon-based infiltration layer 730 is disposed underneath carbon-based layer 701, wherein infiltration layer 730 has substantially the same characteristics as the corresponding infiltration layer in the first embodiment.

In FIG. 7B, a metal reinforcement layer 731 is disposed directly underneath infiltration layer 730, wherein metal reinforcement layer 731 provides extra strength to the carbon-based substrate. Metal reinforcement layer 731 can comprise a multilayer metal structure or a single metal structure. Additionally, metal reinforcement layer 731 can be made of a single element metal or an alloy. In one embodiment, the thickness of metal layer 731 is greater than 1 μm.

In one embodiment of the present invention, metal layer 731 is made of Ag. Alternatively, metal reinforcement layer 731 can be made of Cu, Cu/Tungsten (W) alloy, Cu/Molybdenum (Mo) alloy, or any other alloy that has a thermal conductivity greater than that of a Si-based alloy. If metal reinforcement layer 731 comprises primarily Cu or Cu alloy, it is important that metal reinforcement layer 731 be protected by a conducting layer, and that this protective layer is resistant to Si-etchants.

The carbon/metal composite substrate also comprises an infiltration layer 726 and a bonding layer 728. Note that infiltration layer 726 and bonding layer 728 have substantially the same characteristics as the corresponding infiltration layer and corresponding bonding layer in the first embodiment.

Figure 7C:
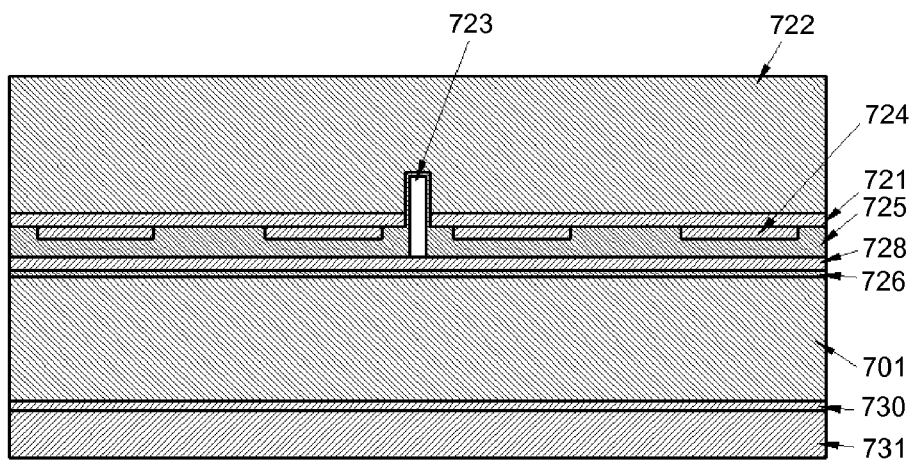
FIG. 7C illustrates the cross-sectional view of the epitaxial substrate in FIG. 7A and the carbon/metal composite substrate in FIG. 7B after wafer bonding in accordance with one embodiment of the present invention.

FIG. 7C illustrates the cross-sectional view of the epitaxial substrate in FIG. 7A and the carbon/metal composite substrate in FIG. 7B after wafer bonding in accordance with one embodiment of the present invention.

To allow bonding layer 728 of the carbon/metal composite substrate and bonding layer 725 of the epitaxial substrate to be firmly welded together, the combined substrates in FIG. 7C is subjected to heating and pressure over a specific period. Note that the bonding conditions and environment can be substantially the same as the corresponding conditions and environment in the first embodiment.

After the carbon-based substrate and the epitaxial substrate have been firmly welded together, the combined structure is put into a Si-etchant. Si-etchant etches and removes original growth substrate 722 on the epitaxial substrate, and facilitates transferring InGaAlN multilayer structures 721 from the epitaxial substrate to the carbon/metal composite substrate, as is shown in FIG. 7D.

Figure 7D:
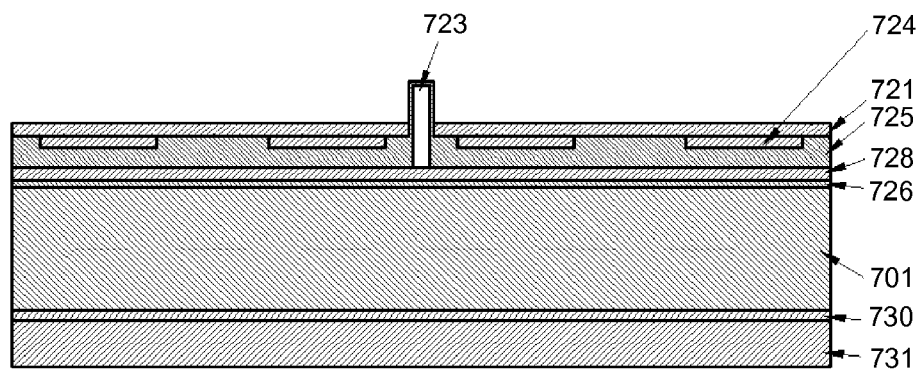
FIG. 7D illustrates the cross-sectional view of the light-emitting device which is transferred on the carbon/metal composite substrate by removing the epitaxial substrate in FIG. 7C in accordance with one embodiment of the present invention.

Hence, FIG. 7D illustrates the cross-sectional view of the light-emitting devices which are transferred on the carbon/metal composite substrate by removing the epitaxial substrate in FIG. 7C.

Figure 7E:
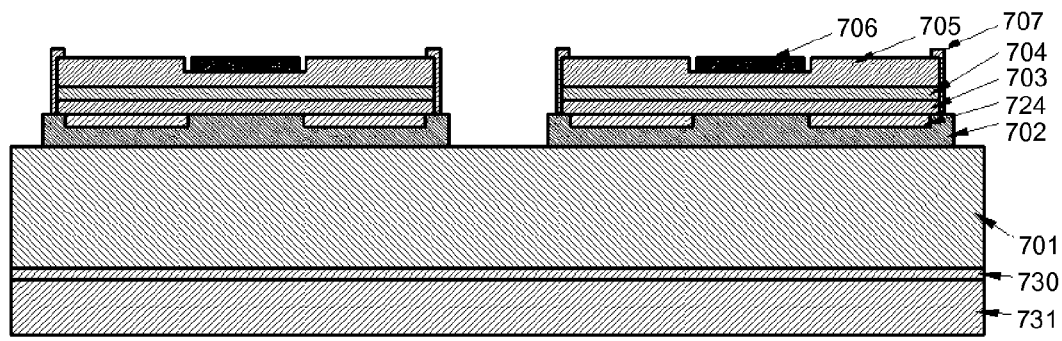
FIG. 7E illustrates the cross-sectional view of a chip array formed on the carbon/metal composite substrate after a sequence of wafer fabrication processes in accordance with one embodiment of the present invention.

After removing original growth substrate 722, a sequence of wafer fabrication processes are performed to obtain the chip array as shown in FIG. 7E. These wafer fabrication processes are substantially the same as the corresponding wafer fabrication processes used to obtain the chip array in the first embodiment.

Hence, FIG. 7E illustrates the cross-sectional view of the chip array formed on the carbon/metal composite substrate after the sequence of wafer fabrication processes.

Figure 7F:
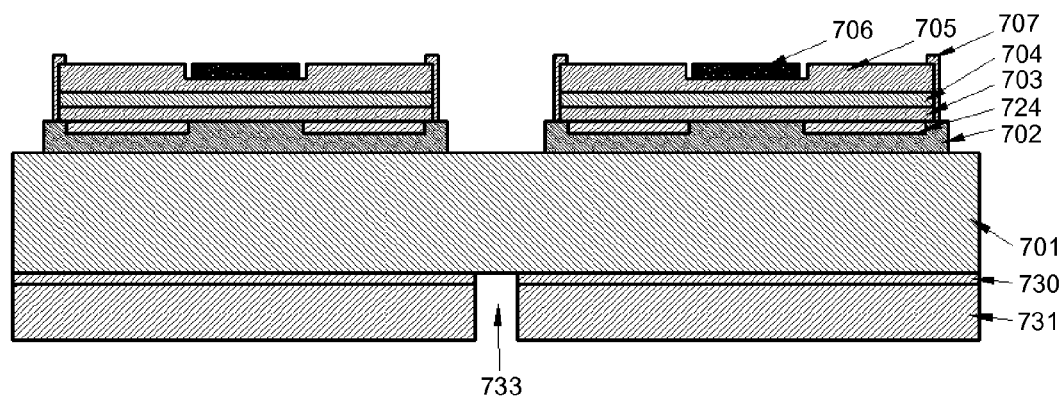
FIG. 7F illustrates the cross-sectional view of the chip array in FIG. 7E after forming dicing channels in the substrate reinforcement layer to face the gaps between the chips in accordance with one embodiment of the present invention.

FIG. 7F illustrates the process of dicing the wafer of FIG. 7E in accordance with one embodiment of the present invention.

The process starts by creating dicing channels 733 on the backside of the carbon/metal composite substrate using a combined photolithographic patterning and chemical etching technique. Dicing channels are also created on the front-side of the carbon/metal composite substrate. Note that the front-side dicing channels are obtained using substantially the same technique that creates dicing channels 632 in the first embodiment. Finally, the wafer is separated along these dicing channels using a wafer-dicing machine, thereby obtaining single-unit light-emitting devices.

Figure 7G:
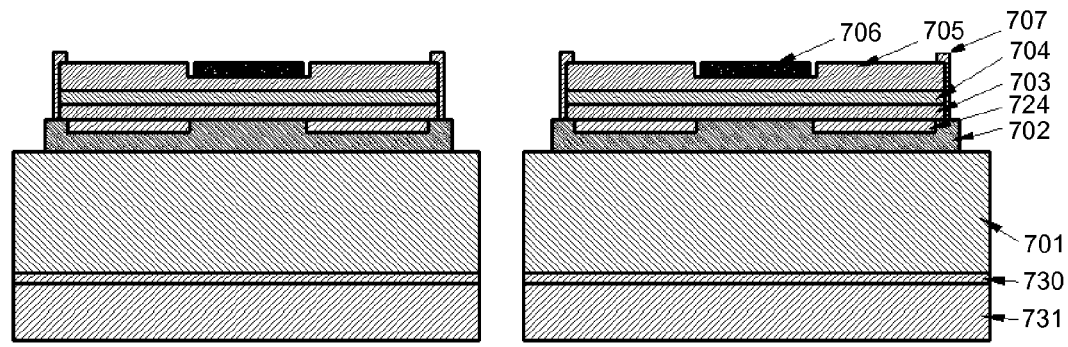
FIG. 7G illustrates the cross-sectional view of the array of individual chips separated by mechanical sawing the carbon/metal composite substrate in FIG. 7F in accordance with one embodiment of the present invention.

FIG. 7G illustrates the cross-sectional view of the array of individual chips obtained from dicing the carbon/metal composite substrate in FIG. 7F in accordance with one embodiment of the present invention.

In one embodiment of the present invention, after wafer fabrication process is completed, metal reinforcement layer 731 can be removed from carbon-based layer 701. In this embodiment, metal reinforcement layer 731 serves as a temporary structure that provides substrate support during the wafer fabrication process.

Third Embodiment

Figure 3:
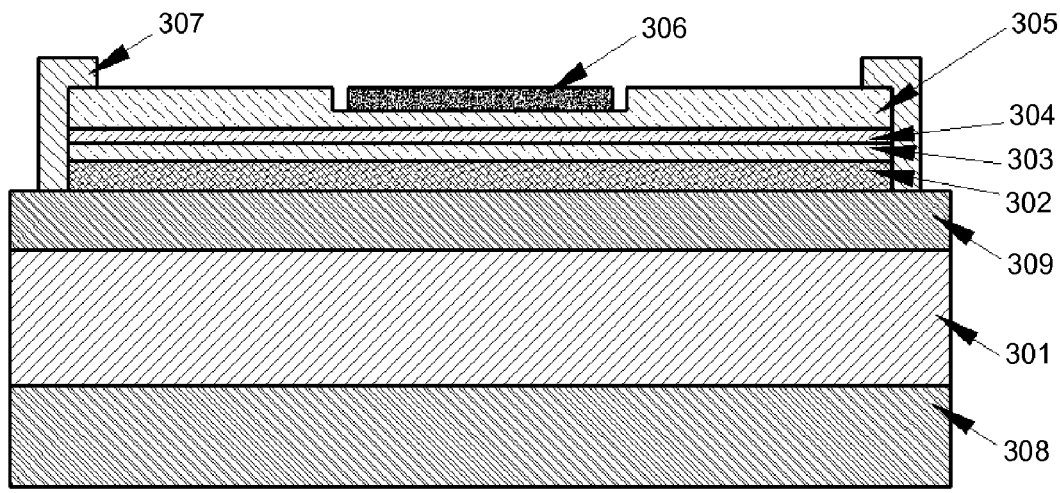
FIG. 3 illustrates a cross-sectional view of an InGaAlN-based light-emitting device on a carbon-based substrate, which is obtained using a third fabrication process in accordance with one embodiment of the present invention.

FIG. 3 illustrates a cross-sectional view of an InGaAlN-based light-emitting device on a carbon-based substrate, which is obtained using a third fabrication process in accordance with one embodiment of the present invention. In one embodiment, the light-emitting device is an LED. Specifically, the light-emitting device in FIG. 3 is formed by wafer-bonding an InGaAlN-based multilayer structure onto a metal/carbon/metal composite substrate using a metal-bonding technique.

More specifically, the structure of FIG. 3 comprises the following components: a carbon-based layer 301; a metal layer 302 which is disposed between the InGaAlN-based multilayer structure and the carbon-based substrate; a P-type GaN layer 303; an InGaN/GaN MQW active layer 304; and an N-type GaN layer 305. The structure of FIG. 3 further comprises a second Ohmic-contact electrode 306, sidewall passivation material 307, and metal layers 308 and 309 which are used to reinforce carbon-based layer 301.

FIG. 8A-8G illustrates a step-by-step process for fabricating the light-emitting device in FIG. 3 in accordance with one embodiment of the present invention. Note that certain carbon-materials used to make carbon-based layer 301 can have very high thermal conductivity but relatively low strength. Hence, a metal/carbon/metal composite substrate structure can enhance the strength of the carbon-based substrate by depositing sufficiently thick metal layers on both sides of the carbon-based substrate. On the other hand, although metal has high thermal conductivity, a metal substrate is typically difficult to dice. Consequently, one embodiment of the present invention can attain both high thermal conductivity devices and the flexibility in chip array separation.

FIG. 6A illustrates the epitaxial substrate for fabricating the light-emitting device in FIG. 3 in accordance with one embodiment of the present invention. The epitaxial substrate used in fabricating the devices of FIG. 3 has substantially the same characteristics as the epitaxial substrates used in the first and second embodiments.

Figure 8A:
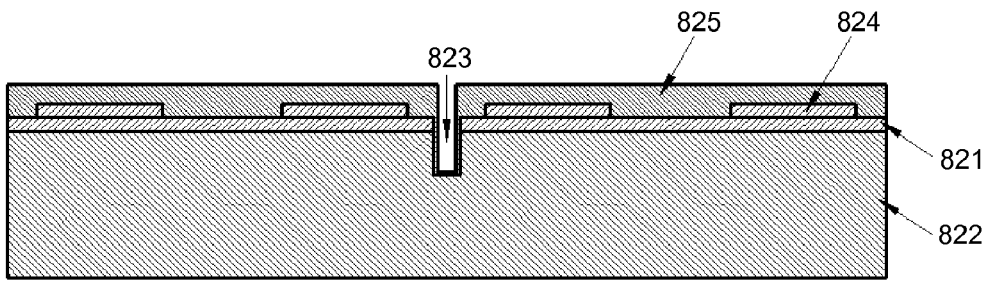
FIG. 8A illustrates the cross-sectional view of the epitaxial substrate for fabricating the light-emitting device in FIG. 3 after depositing an Ohmic-contact layer and a metal bonding layer in accordance with one embodiment of the present invention.

FIG. 8A illustrates the cross-sectional view of the epitaxial substrate for fabricating the light-emitting device in FIG. 3 after depositing an Ohmic-contact layer 824 and a metal bonding layer 825 in accordance with one embodiment of the present invention. Note that the epitaxial substrate as is shown in FIG. 8A has substantially the same characteristics as the epitaxial substrates after depositing the corresponding Ohmic-contact layers and metal bonding layers in the first and second embodiments.

Figure 8B:
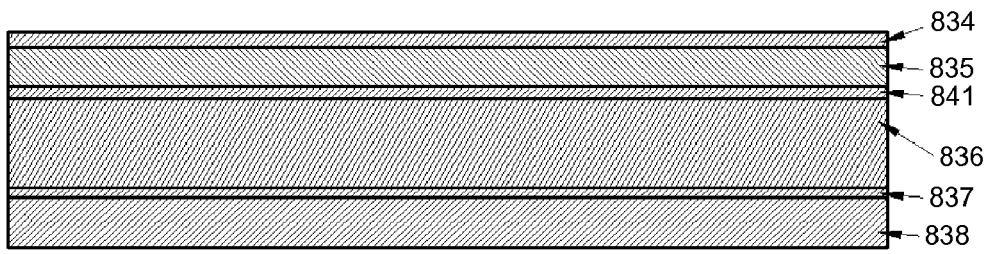
FIG. 8B illustrates the cross-sectional view of the metal/carbon/metal composite substrate in FIG. 2, which comprises two carbon-material infiltration layers, two substrate-strength-enhancing layers, and a metal bonding layer in accordance with one embodiment of the present invention.

FIG. 8B illustrates the cross-sectional view of the metal/carbon/metal composite substrate after forming graphite infiltration layers 837 and 841, metal reinforcement layers 835 and 838, and a metal bonding layer 834 in accordance with one embodiment of the present invention.

The metal/carbon/metal composite substrate comprises a carbon-based layer 836, which has substantially the same characteristics as the corresponding carbon-based layers in the first and second embodiments. The carbon-based infiltration layers 837 and 841 have substantially the same characteristics as the corresponding infiltration layers in the first and second embodiments.

In FIG. 8B, metal reinforcement layers 835 and 838 are disposed directly above and underneath infiltration layers 837 and 841, respectively, wherein these metal layers provide extra strength to carbon-based layer 836. Each of the metal layers 835 and 838 can comprise a multilayer metal structure or a single metal structure. Additionally, they can be made of a single-element metal or an alloy. In one embodiment, each of the metal layers is greater than 1 µm.

In one embodiment of the present invention, metal layers 835 and 838 are made of Ag. In a further embodiment, these metal layers can be made of Cu, Cu/W alloy, Cu/Mo alloy, or any other alloy that has a thermal conductivity greater than that of Si. It is important that metal layers 835 and 838 be protected by a conducting layer, and that this protective layer is resistant to Si-etchants. This protective layer can also be an insulator. If so, this protective layer needs to be removed after the subsequent Si-etching process.

The metal/carbon/metal composite substrate also comprises a metal bonding layer 834. Note that metal bonding layer 834 have substantially the same characteristics as the corresponding metal bonding layer in the first and second embodiments.

Figure 8C:
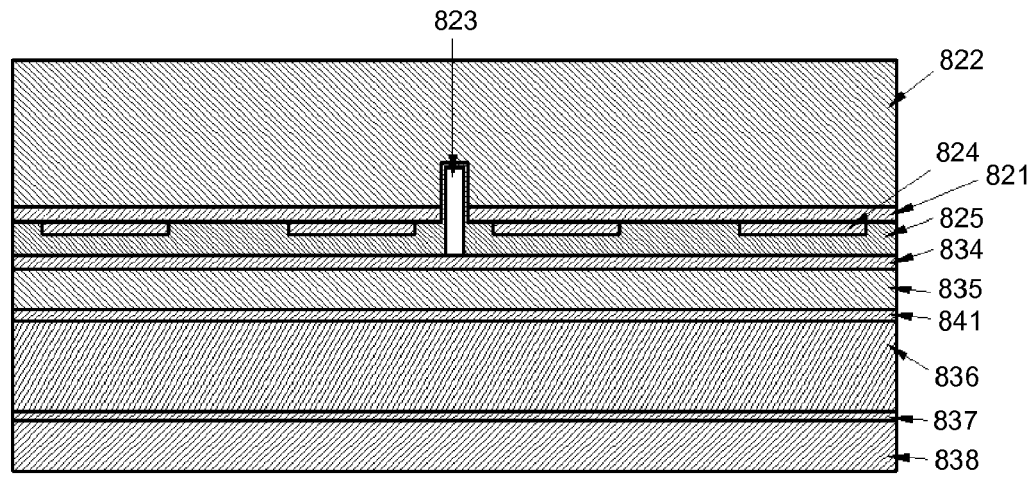
FIG. 8C illustrates the cross-sectional view of the epitaxial substrate in FIG. 8A and the metal/carbon/metal composite substrate in FIG. 8B after wafer bonding in accordance with one embodiment of the present invention.

FIG. 8C illustrates the cross-sectional view of the epitaxial substrate in FIG. 8A and the metal/carbon/metal composite substrate in FIG. 8B after wafer bonding in accordance with one embodiment of the present invention.

To allow bonding layer 834 of the metal/carbon/metal composite substrate and bonding layer 825 of the epitaxial substrate to be firmly welded together, the combined substrates in FIG. 8C is subjected to heating and pressure over a specific period. Note that the bonding conditions and environment are substantially the same as the corresponding conditions and environments in the first and second embodiments.

After the carbon-based substrate and the epitaxial substrate have been firmly welded together, the combined structure is put into a Si-etchant. Si-etchant etches and removes original growth substrate 822 on the epitaxial substrate, and facilitates transferring InGaAlN multilayer structures 821 from the epitaxial substrate to the metal/carbon/metal composite substrate, as is shown in FIG. 8D.

Figure 8D:
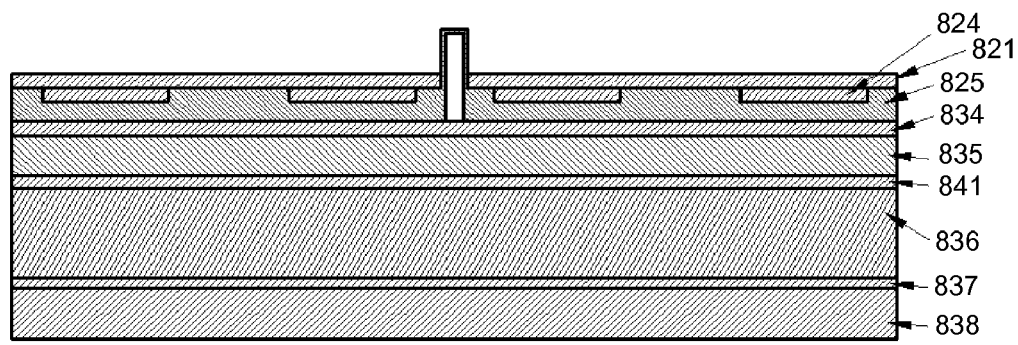
FIG. 8D illustrates the cross-sectional view of the light-emitting device which is transferred on the metal/carbon/metal composite substrate by removing the epitaxial substrate in FIG. 8C in accordance with one embodiment of the present invention.

Hence, FIG. 8D illustrates the cross-sectional view of the light-emitting devices which are transferred on the metal/carbon/metal composite substrate by removing the epitaxial substrate in FIG. 8C.

Figure 8E:
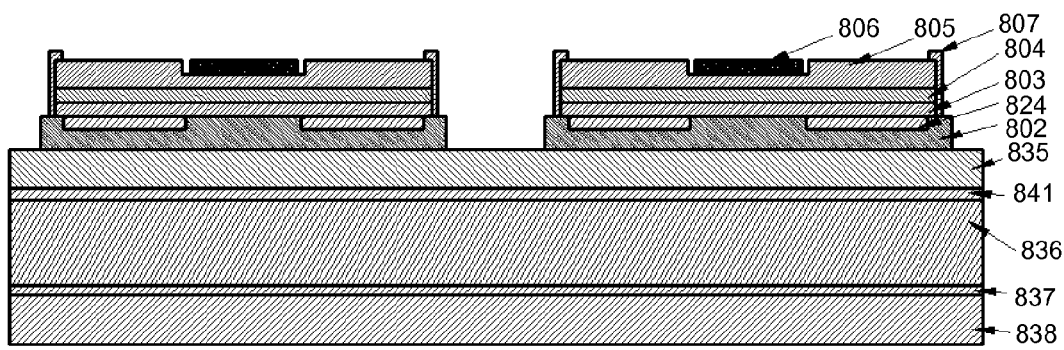
FIG. 8E illustrates the cross-sectional view of a chip array formed on the metal/carbon/metal composite substrate after a sequence of wafer fabrication processes in accordance with one embodiment of the present invention.

After removing original growth substrate 822, a sequence of wafer fabrication processes are performed to obtain the chip array as shown in FIG. 8E. These wafer fabrication processes are substantially the same as the corresponding wafer fabrication processes using to obtain the chip arrays in the first and second embodiments.

Hence, FIG. 8E illustrates the cross-sectional view of the chip array formed on the metal/carbon/metal composite substrate after the sequence of wafer fabrication processes.

Figure 8F:
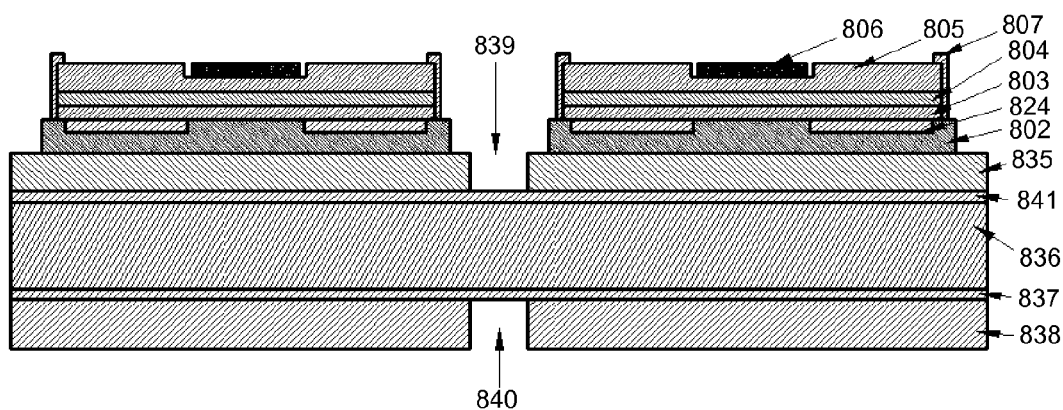
FIG. 8F illustrates the cross-sectional view of the chip array in FIG. 8E after forming dicing channels in both front and back substrate reinforcement layers in the gaps between the chips in accordance with one embodiment of the present invention.

FIG. 8F illustrates the process of dicing the wafer of FIG. 8E in accordance with one embodiment of the present invention.

As shown in FIG. 8F, the process starts by creating dicing channels 839 and 840 on both the front-side and the backside of the metal/carbon/metal composite substrate using a combined photolithographic patterning and chemical etching technique. Next, the wafer is separated along these dicing channels using a wafer-dicing machine, thereby obtaining single-unit light-emitting devices.

Figure 8G:
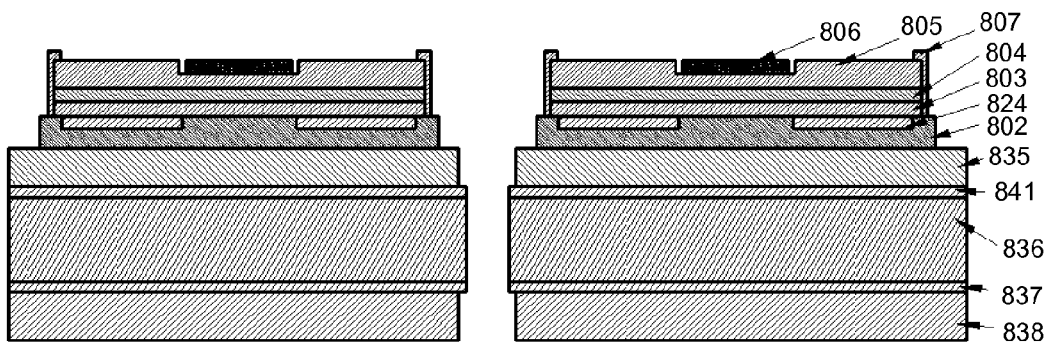
FIG. 8G illustrates the cross-sectional view of the array of individual chips separated by mechanical sawing the metal/carbon/metal composite substrate in FIG. 8F in accordance with one embodiment of the present invention.

FIG. 8G illustrates the cross-sectional view of the array of individual chips obtained from dicing the metal/carbon/metal composite substrate in FIG. 8F in accordance with one embodiment of the present invention.

In one embodiment of the present invention, after wafer fabrication process is completed, metal reinforcement layer 838 can be removed from carbon-based layer 801. In this embodiment, metal reinforcement layer 838 serves as a temporary structure that provides substrate reinforcement during the wafer fabrication process.

Fourth Embodiment

Figure 4:
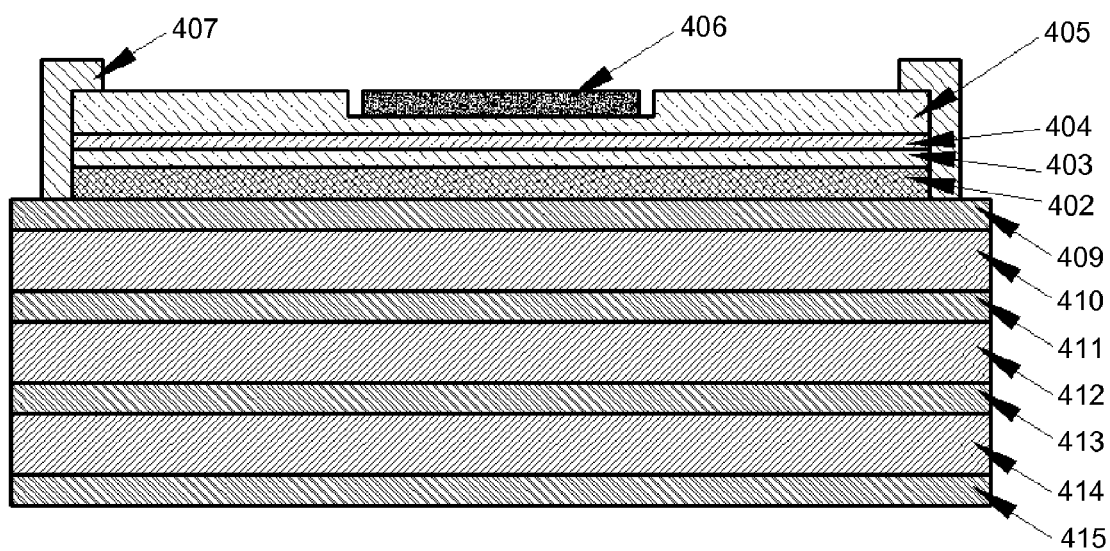
FIG. 4 illustrates a cross-sectional view of an InGaAlN-based light-emitting device on a carbon-based substrate, which is obtained using a fourth fabrication process in accordance with one embodiment of the present invention.

FIG. 4 illustrates a cross-sectional view of an InGaAlN-based light-emitting device on a carbon-based substrate, which is obtained using a fourth fabrication process in accordance with one embodiment of the present invention. In one embodiment, the light-emitting device is an LED. Specifically, the light-emitting device in FIG. 4 is formed by wafer-bonding an InGaAlN-based multilayer structure onto a multilayer carbon/metal composite substrate using a metal-bonding technique.

More specifically, the wafer structure in FIG. 4 comprises the following components: a metal layer 402 which is disposed between the InGaAlN-based multilayer structure and the carbon-based substrate, a P-type GaN layer 403, an InGaN/GaN MQW active layer 404, and an N-type GaN layer 405. The structure of FIG. 4 further comprises a second Ohmic-contact electrode 406, sidewall passivation material 407, multiple carbon-based layers 410, 412, and 414, and multiple metal layers 409, 411, 413, and 415, which provide reinforcement to the carbon-based layers.

Note that the epitaxial substrate used in fabricating the devices of FIG. 4 has substantially the same characteristics as the epitaxial substrates used in the first, second, and third embodiments. Furthermore, the Ohmic-contact layers and metal bonding layers in FIG. 4 have substantially the same characteristics as the corresponding Ohmic-contact layers and corresponding metal bonding layers in the first, second, and third embodiments.

In one embodiment of the present invention, the wafer structure in FIG. 4 is obtained as follows. First, a number of carbon-based layers are received, and carbon infiltration layers are deposited on both sides of each of the carbon-based layers. Metal bonding layers are then deposited on the infiltration layers on both sides of each of the carbon-based layers. Next, the multiple carbon-based layers comprising double-sided metal layers and the epitaxial substrate comprising the Ohmic-contact layer and the metal bonding layer are stacked and welded together. Finally, the chip array is fabricated using substantially the same wafer fabrication processes that are used in the first, second, and third embodiments.

Note that this embodiment of the present invention allows graphite cloth, carbon fiber cloth, and other laminated high-thermal-conductivity carbon-based materials to be used to prepare high thermal conductivity light emitting devices. In particular, the carbon-based substrate of this embodiment is formed by laminating and bonding multiple thin layers of carbon-based material together. The number of the thin layers can be equal to or greater than three. For the purpose of mechanical wafer dicing, the thicknesses of metal layers 411 and 413 in this embodiment is no more than 10 µm. On the other hand, metal layers 409 and 415 can be thicker or thinner than 10 µm.

If metal layers 409 and 415 are relatively thick, a wafer dicing process substantially similar to the one used in the third embodiment can be applied. Specifically, dicing channels are etched in the wafer using a combined photolithographic patterning and chemical etching technique, which is followed by a wafer-scribing process to separate the chips along these dicing channels.

Note that the multilayer carbon/metal composite substrate of the current embodiment can be obtained by bonding multiple single carbon layers simultaneously with bonding the epitaxial substrate to the carbon-based substrate. Alternatively, the multilayer carbon/metal composite substrate can be obtained prior to wafer-bonding the epitaxial substrate to the carbon-based substrate.

Fifth Embodiment

Figure 5:
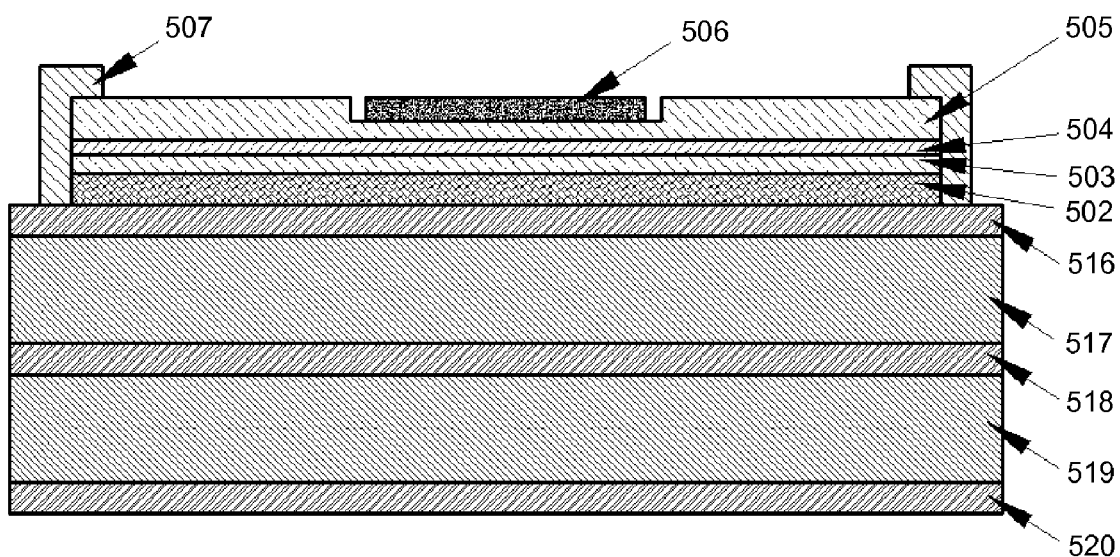
FIG. 5 illustrates a cross-sectional view of an InGaAlN-based light-emitting device on a carbon-based substrate, which is obtained using a fifth fabrication process in accordance with one embodiment of the present invention.

FIG. 5 illustrates a cross-sectional view of an InGaAlN-based light-emitting device on a carbon-based substrate, which is obtained using a fifth fabrication process in accordance with one embodiment of the present invention. In one embodiment, the light-emitting device is an LED. Specifically, the light-emitting device in FIG. 5 is formed by wafer-bonding an InGaAlN-based multilayer structure onto a metal/carbon/metal/carbon/metal composite substrate using a metal-bonding technique.

More specifically, the wafer structure in FIG. 5 comprises the following components: a metal layer 502 which is disposed between the InGaAlN-based multilayer structure and the carbon-based substrate; a P-type GaN layer 503; an InGaN/GaN MQW active layer 504; and an N-type GaN layer 505. The structure of FIG. 5 further comprises a second Ohmic-contact electrode 506, sidewall passivation material 507, carbon-based layers 517 and 519, and multiple metal layers 516, 518, and 520, which provide reinforcement to the carbon-based layers. In particular, metal layer 518 is a thin layer with a thickness less than 20 µm.

Note that the epitaxial substrate used in fabricating the devices of FIG. 5 has substantially the same characteristics as the epitaxial substrates used in the first, second, third, and fourth embodiments. Furthermore, the Ohmic-contact layers and metal bonding layers in FIG. 5 have substantially the same characteristics as the corresponding Ohmic-contact layers and corresponding metal bonding layers in the first, second, third, and fourth embodiments.

In one embodiment of the present invention, the wafer structure in FIG. 5 is obtained as follows. First, two carbon-based layers are received, and carbon-based infiltration layers are deposited on both sides of each of the carbon-based layers. Metal bonding layers are then deposited on the infiltration layers on both sides of each of the carbon-based layers. Next, the two carbon-based layers comprising double-sided metal layers and the epitaxial substrate comprising the Ohmic-contact layer and the metal bonding layer are stacked and welded together. The chip array is fabricated using substantially the same wafer fabrication processes that are used in the first, second, third, and fourth embodiments. Finally, the array of chips are separated using substantially the same wafer dicing techniques used in the first, second, third, and fourth embodiments.

Note that if carbon-based layers 517 and 519 in FIG. 5 are made of natural graphite, pyrolytic graphite, or other carbon-based materials which have anisotropic thermal conduction characteristics, the atomic-lattice planes of layers 517 and 519 can be placed perpendicular to the plane of the InGaAlN-based multilayer structure. Furthermore, carbon-based layers 517 and 519 can be arranged such that their atomic-lattice planes are kept at a specific angle with respect to each other. In a preferred embodiment, this angle is 90°.

Note that the metal/carbon/metal/carbon/metal composite substrate of the current embodiment can be obtained by bonding two single carbon layers at the same time of bonding the epitaxial substrate to the carbon-based substrate. Alternatively, the metal/carbon/metal/carbon/metal composite substrate can be obtained prior to wafer-bonding the epitaxial substrate to the carbon-based substrate.

If one or both metal layers 516 and 518 are relatively thick, a wafer dicing process substantially similar to the one used in the third embodiment can be applied. Specifically, dicing channels are etched in the wafer using a combined photolithographic patterning and chemical etching technique, which is followed by a wafer-scribing process to separate the chips along these dicing channels.

Metal layer 518 can be a thin layer with a thickness less than 10 µm, or a thick layer with a thickness greater than 10 µm. If metal layer 518 is thicker than 10 µm, dicing channels can be first created in the carbon-based layers on both sides of metal layer 518. Next, the sections of metal layer 518 in the gaps between the chip arrays are etched away using a chemical-etching process, which causes the array of chips to separate.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An InGaAlN-based semiconductor light-emitting device, comprising:
    an InGaAlN-based semiconductor multilayer structure; and
    a carbon-based substrate which supports the InGaAlN-based semiconductor multilayer structure, wherein the carbon-based substrate comprises a first carbon-based layer and at least one metal layer on a front-side of the first carbon-based layer facing the InGaAlN-based semiconductor multilayer structure, and wherein the first carbon-based layer includes graphite.

2. The InGaAlN-based semiconductor light-emitting device of claim 1, wherein the first carbon-based layer comprises one or more of the following materials:
    natural graphite;
    compressed graphite;
    pyrolytic graphite;
    metal impregnated graphite;
    carbon fiber-based compressed or knitted material;
    carbon nanotube-based laminated material; or
    a compound or mixture material containing two or more of the above.

3. The InGaAlN-based semiconductor light-emitting device of claim 1,
wherein the carbon-based substrate can further include:
one or more metal layers on a backside of the first carbon-based layer.

4. The InGaAlN-based semiconductor light-emitting device of claim 1, wherein the InGaAlN-based semiconductor multilayer structure comprises a plurality of $In_xGa_yAl_{1-x-y}$ ($0 \leq x \leq 1$, $0 \leq y \leq 1$) layers.

5. The InGaAlN-based semiconductor light-emitting device of claim 1, further comprising:
an Ohmic-contact electrode fabricated on the top surface of the InGaAlN-based semiconductor multilayer structure,
wherein the metal layer and the Ohmic-contact electrode form the top and the bottom electrodes for the InGaAlN-based semiconductor light-emitting device.

6. The InGaAlN-based semiconductor light-emitting device of claim 5, wherein the Ohmic-contact electrode on the top surface of the InGaAlN-based semiconductor multilayer structure can comprise one or more of:
a ternary alloy comprising Au, Germanium (Ge), and nickel (Ni);
a Au/Si alloy;
a ternary alloy comprising Au, Si, and Ni;
a Titanium Nitride (TiN) deposition layer;
a deposition layer comprising TiN;
a Ti/Aluminum (Al) alloy; and
a multilayer structure or mixture of the above.

7. The InGaAlN-based semiconductor light-emitting device of claim 5, wherein the metal layer between the first carbon-based layer and the InGaAlN-based semiconductor multilayer structure contains one or more chemically stable metal elements which include at least one of the following elements either in single element form or in an alloy form:
Au;
Pt;
Pd; and
Rh.

8. The InGaAlN-based semiconductor light-emitting device of claim 5,
wherein the metal layer situated between the first carbon-based layer and the InGaAlN-based semiconductor multilayer structure has a multilayer metal structure;
wherein an interface between two adjacent layers in the multilayer metal structure has an adhesion mechanism; and
wherein the multilayer metal structure can include one or more of:
a single-element layer;
an alloy layer; and
a non-metallic layer.

9. The InGaAlN-based semiconductor light-emitting device of claim 8, wherein at least one layer in the multilayer metal structure is etch-resistant to a Si etchant.

10. The InGaAlN-based semiconductor light-emitting device of claim 8, wherein a layer in the multilayer metal structure that is not etch-resistant to a Si etchant is surrounded by one or more layers in the multilayer metal structure that are etch-resistant to the Si etchant and by the InGaAlN-based semiconductor multilayer structure.

11. The InGaAlN-based semiconductor light-emitting device of claim 8, wherein surfaces of a layer in the multilayer metal structure that is not etch-resistant to a Si etchant can react with adjacent layers or become alloyed during a device fabrication process, thereby causing the layer to become etch-resistant to the Si etchant.

12. The InGaAlN-based semiconductor light-emitting device of claim 8,
wherein the multilayer metal structure comprises a first Ohmic-contact layer for the InGaAlN-based semiconductor multilayer structure; and
wherein the first Ohmic-contact layer can have a single layer structure or a multilayer structure.

13. The InGaAlN-based semiconductor light-emitting device of claim 12, wherein the first Ohmic-contact layer can be:
a single-element metal layer;
an alloy layer comprising two or more elements;
a partial alloy layer;
a non-metallic layer; or
a layer comprising multiple regions, wherein each region can comprise a different material, which includes single element metal, alloy, partial alloy, non-metallic material, or a combination of the above.

14. The InGaAlN-based semiconductor light-emitting device of claim 12, wherein the first Ohmic-contact layer can be a continuous layer or an array of metal dots with gaps between the metal dots.

15. The InGaAlN-based semiconductor light-emitting device of claim 12, wherein the first Ohmic-contact layer can be a fully or partially reflective layer or a fully or partially transparent layer.

16. The InGaAlN-based semiconductor light-emitting device of claim 12,
wherein the first Ohmic-contact layer can comprise a single-element metal, or an alloy comprising the single element metal, or both; and
wherein the single-element metal can include:
Pt
Pd;
Rh; or
Ni.

17. The InGaAlN-based semiconductor light-emitting device of claim 1, wherein the first carbon-based layer has a thermal conductivity greater than 0.5 W/cm·K, an electrical resistivity less than 1 Ω/cm, and a room-temperature thermal expansion coefficient less than $16.5^{10-6}$/K.

18. The InGaAlN-based semiconductor light-emitting device of claim 1, wherein the sidewalls of the InGaAlN-based semiconductor multilayer structure are passivated with a passivation material.

19. The InGaAlN-based semiconductor light-emitting device of claim 18, wherein the passivation material includes an organic insulating material, or an inorganic insulating material, or both.

20. The InGaAlN-based semiconductor light-emitting device of claim 1, wherein the InGaAlN-based semiconductor multilayer structure comprises, from the carbon-based substrate, a P-type layer, an active layer, and an N-type layer.

* * * * *